United States Patent
Park et al.

(10) Patent No.: US 7,787,308 B2
(45) Date of Patent: Aug. 31, 2010

(54) FLASH MEMORY DEVICE AND PROGRAM METHOD THEREOF

(75) Inventors: Jin-Sung Park, Gyeonggi-do (KR); Dong-Hun Kwak, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 127 days.

(21) Appl. No.: 12/118,554

(22) Filed: May 9, 2008

(65) Prior Publication Data

US 2008/0279010 A1 Nov. 13, 2008

(30) Foreign Application Priority Data

May 10, 2007 (KR) .................. 10-2007-0045566

(51) Int. Cl.
*G11C 16/04* (2006.01)
*G11C 16/06* (2006.01)

(52) U.S. Cl. .................... 365/185.28; 365/185.22; 365/185.33

(58) Field of Classification Search ............. 365/185.28
See application file for complete search history.

(56) References Cited

U.S. PATENT DOCUMENTS

| | | | | |
|---|---|---|---|---|
| 5,682,472 | A * | 10/1997 | Brehm et al. ................. | 714/25 |
| 6,282,121 | B1 * | 8/2001 | Cho et al. ............... | 365/185.22 |
| 7,139,198 | B2 * | 11/2006 | Guterman et al. ....... | 365/185.22 |
| 7,203,091 | B2 * | 4/2007 | Inoue et al. ............ | 365/185.09 |
| 7,286,400 | B2 * | 10/2007 | Kojima et al. .......... | 365/185.09 |
| 7,352,630 | B2 * | 4/2008 | Lee et al. ............... | 365/185.22 |
| 7,376,012 | B2 * | 5/2008 | Kawamoto et al. ..... | 365/185.09 |
| 7,400,531 | B2 * | 7/2008 | Ohtake et al. .......... | 365/185.11 |
| 7,417,896 | B2 * | 8/2008 | Cho et al. .............. | 365/185.18 |
| 7,434,111 | B2 * | 10/2008 | Sugiura et al. ................ | 714/48 |
| 7,450,417 | B2 * | 11/2008 | Kaneko et al. ......... | 365/185.03 |
| 7,492,634 | B2 * | 2/2009 | Li et al. ................. | 365/185.03 |
| 7,492,642 | B2 * | 2/2009 | Cho et al. .............. | 365/185.23 |
| 7,525,838 | B2 * | 4/2009 | Jung et al. ............. | 365/185.03 |
| 7,590,007 | B2 * | 9/2009 | Futatsuyama .......... | 365/185.22 |
| 2005/0157552 | A1 * | 7/2005 | Hemink et al. ......... | 365/185.03 |
| 2006/0233022 | A1 | 10/2006 | Li | |
| 2006/0285396 | A1 | 12/2006 | Ha | |
| 2007/0097749 | A1 * | 5/2007 | Li et al. ................. | 365/185.22 |
| 2008/0055998 | A1 * | 3/2008 | Jung et al. ............. | 365/185.18 |
| 2008/0183951 | A1 * | 7/2008 | Lee et al. ..................... | 711/103 |
| 2008/0253181 | A1 * | 10/2008 | Edahiro et al. ......... | 365/185.03 |

FOREIGN PATENT DOCUMENTS

| | | |
|---|---|---|
| JP | 2007-102942 | 4/2007 |
| KR | 1998-070971 | 10/1998 |
| KR | 2003-0051402 | 6/2003 |
| KR | 10-0567158 | 3/2006 |

* cited by examiner

*Primary Examiner*—Son L Mai
(74) *Attorney, Agent, or Firm*—Myers Bigel Sibley & Sajovec, PA (57) ABSTRACT

A method for programming a flash memory device comprising programming memory cells via repetition of program loops, a first of the program loops including a program execution interval and a verify read interval, a second of the program loops including the program execution interval, the verify read interval, and a judging interval. Also disclosed is a flash memory device comprising a memory cell array having memory cells arranged in rows and columns, a read/program circuit configured to perform program and read operations to the memory cell array, and a control logic circuit configured to control the read/program circuit so as to perform a judging operation according to a program loop number.

18 Claims, 10 Drawing Sheets

Fig. 1

(PRIOR ART)

Fig. 2

(PRIOR ART)

FLASH MEMORY DEVICE AND PROGRAM METHOD THEREOF

CROSS-REFERENCE TO RELATED APPLICATIONS

This U.S. non-provisional patent application claims priority under 35 U.S.C. §119 of Korean Patent Application No. 10-2007-0045566 filed on May 10, 2007, the entire contents of which are hereby incorporated by reference.

BACKGROUND

The present invention disclosed herein relates to a semiconductor memory device and more particularly, to a non-volatile semiconductor memory device and program method.

Demand has increased with respect to semiconductor memory devices that are electrically erased and programmed without needing of a refresh operation for retaining stored data. Further, the demand for semiconductor memory devices with large volume and high integration continues to increase. A NAND flash memory device may provide large volume and high integration without a refresh operation for keeping stored data. Since stored data is kept even at power-off, the NAND flash memory device is widely used by electronic apparatuses where a power is suddenly turned off.

Figure 1:
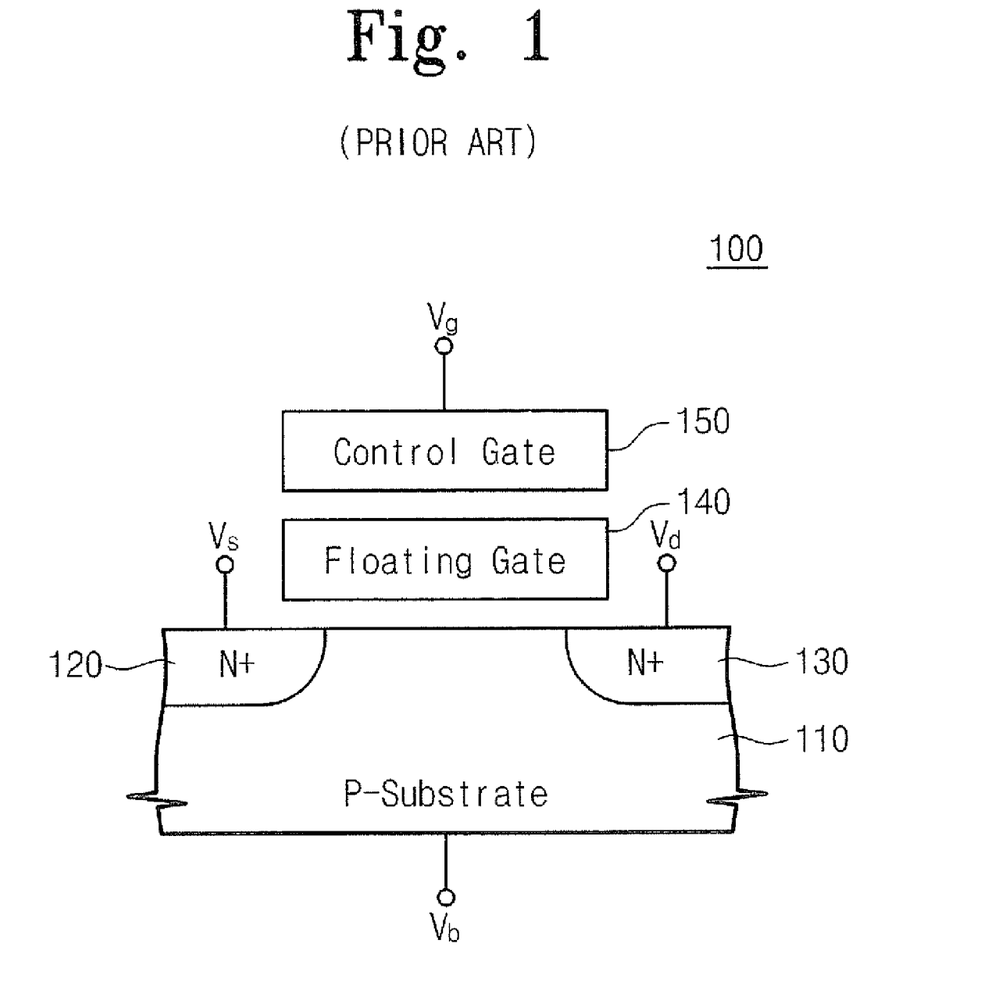
FIG. 1 is a cross-sectional view of a conventional flash memory cell.

FIG. 1 is a cross-sectional view of a conventional flash memory cell. Referring to FIG. 1, a flash memory cell 100 includes a source 120, a drain 130, a floating gate 140, and a control gate 150. The source and drain 120 and 130 are formed on a P-type semiconductor substrate 110 and are spaced apart by a channel region. The floating gate 140 is formed over the channel region with a thin insulation film interposed therebetween, and the control gate 150 is formed over the floating gate 140 with an insulation film interposed therebetween.

The source 120, the drain 130, the control gate 150 and the substrate 110 are connected with corresponding terminals Vs, Vd, Vg, and Vb, respectively, for receiving voltages required for program, erase, and read modes of operation. For example, during a program mode of operation, a program voltage (e.g., about 15V~20V) is applied to a selected word line and a pass voltage (e.g., about 10V) lower than the program voltage is applied to unselected word lines, respectively.

In general, it is difficult to program a flash memory cell 100 via one program operation under the above-described voltage condition. The program operation may be ended when a threshold voltage of a programmed memory cell becomes sufficiently high by means of electron injection into its floating gate. After the program operation, a verify read operation is required to verify whether enough amount of charge is accumulated in a floating gate of a programmed memory cell to increase a threshold voltage of the programmed memory cell.

Figure 2:
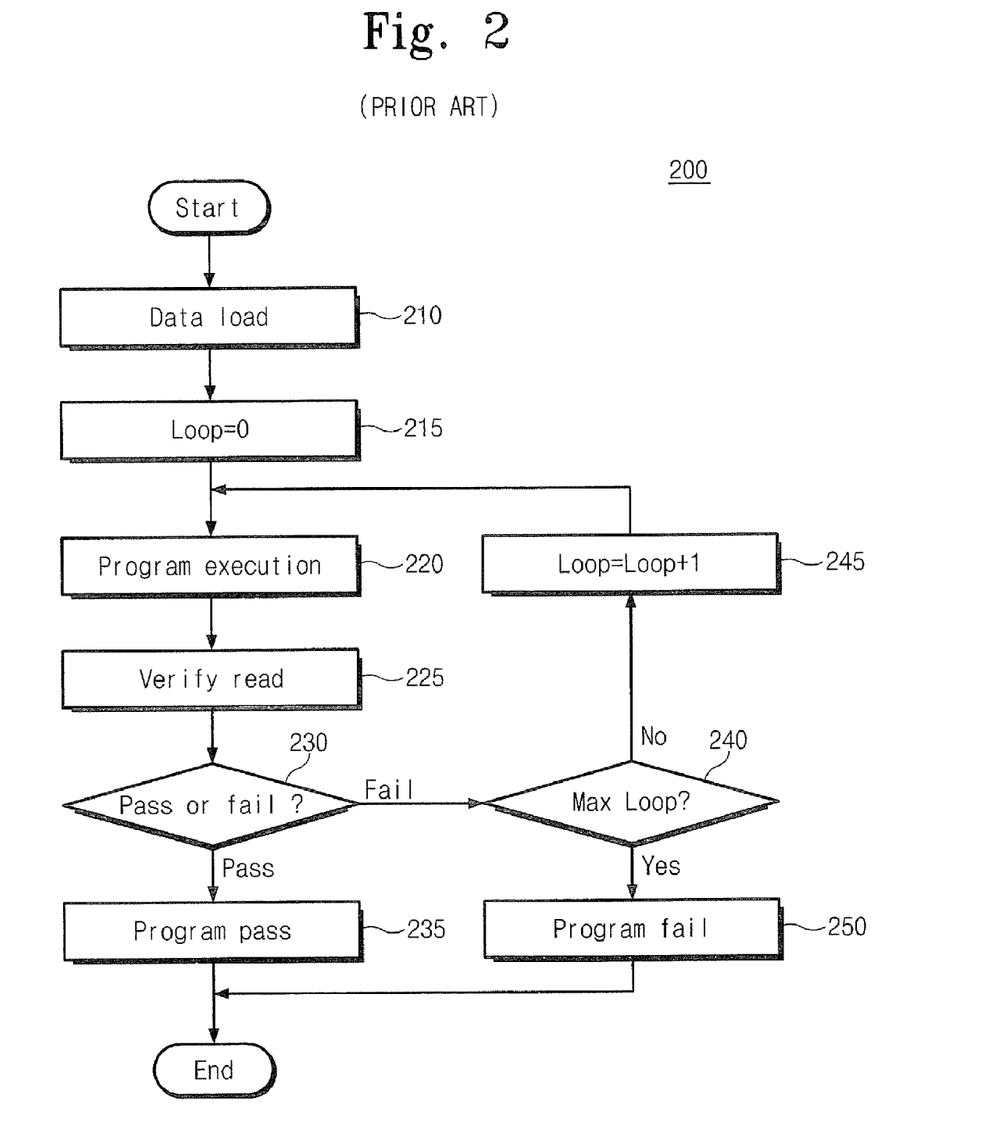
FIG. 2 is a flow diagram for describing a program operation of a conventional non-volatile memory device.

FIG. 2 is a flow diagram for describing a program operation of a conventional non-volatile memory device. Once a program mode of operation commences, at block 210, data to be programmed is loaded onto a page buffer circuit in a non-volatile memory device. At block 215, a loop count value indicating a loop number is reset to have a value of '0.' At the next block 220, the loaded data in the page buffer circuit is programmed in a selected memory cell. An operation where data is programmed in a selected memory cell is well known to one skilled in the art, and description thereof is thus omitted.

At block 225, a verify read operation is carried out to judge whether the selected memory cell has a required/target threshold voltage. Data read out via the verify read operation may be stored in the page buffer circuit.

A control signal indicating a program pass or fail may be produced according to data stored in the page buffer circuit. In general, data stored in the page buffer circuit has a value complementary to the control signal. For example, in the case that data stored in the page buffer circuit is '0,' the control signal has a value of logically '1.' In the case that data stored in the page buffer circuit is '1,' the control signal has a value of logically '0.' Alternatively, it is possible to establish the data and the control signal so as to have the same value. Afterwards, the description will be made on the basis that data stored in the page buffer circuit has a value complementary to the control signal.

The control signal may be applied to a pass/fail check circuit (not shown) with a wired-OR structure. In accordance with the wired-OR structure, all control signals from the page buffer circuit may be provided as inputs of an OR gate.

At block 230, the pass/fail check circuit judges whether all control signals from the page buffer circuit have a program pass value (e.g., 0). If all control signals from the page buffer circuit are judged to have a program pass value, at block 235, a program operation is judged to be performed normally. Afterwards, the program mode of operation is ended.

If at least one control signal from the page buffer circuit has a program fail value (e.g., 1), that is, when the program operation is judged to be failed, then at block 240, it is judged whether a current loop number reaches a maximum loop number. If the current loop number reaches the maximum loop number, then at block 250, a program operation is judged to be performed abnormally. Afterwards, the program mode of operation is ended.

If the current loop number is lower than the maximum loop number, at block 245, the current loop number is increased by 1, and the procedure goes to block 220. Afterwards, the program operation is repeated in the above-described manner.

Figure 3:
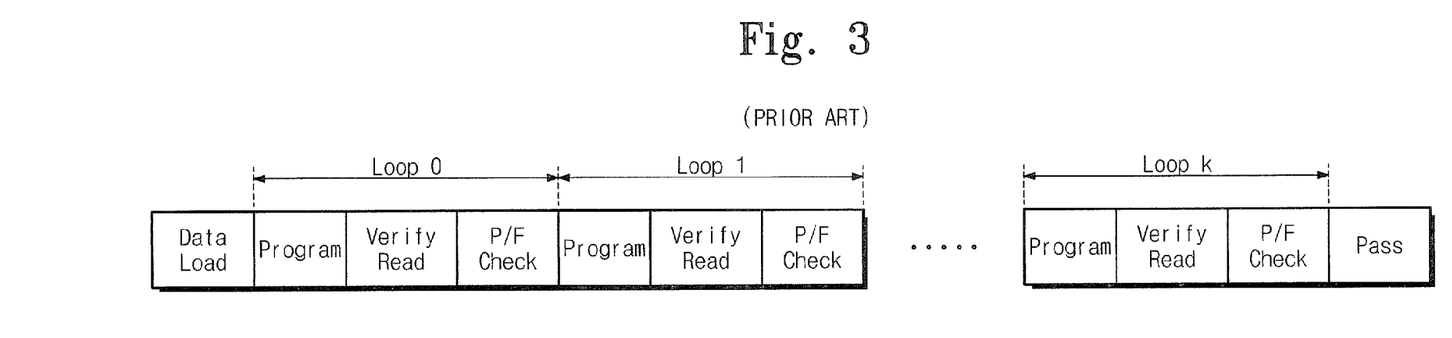
FIG. 3 is a diagram showing a case where a program operation results in a program pass.

FIG. 3 is a diagram showing a case where a program operation results in a program pass. As illustrated in FIG. 3, data is loaded onto a page buffer. Next, a first loop is carried out. Each loop consists of a program operation (or, interval), a verify read operation (or, interval), and a pass/fail check operation (or, a judging operation/interval). A program operation is repeated until it is judged to result in a program pass, with a loop number being increased for each repetition. In the case that a program operation is judged to be passed at a pass/fail check operation of a kth loop (i.e., at Loop k of FIG. 3) the program mode of operation is ended as a program pass.

Figure 4:
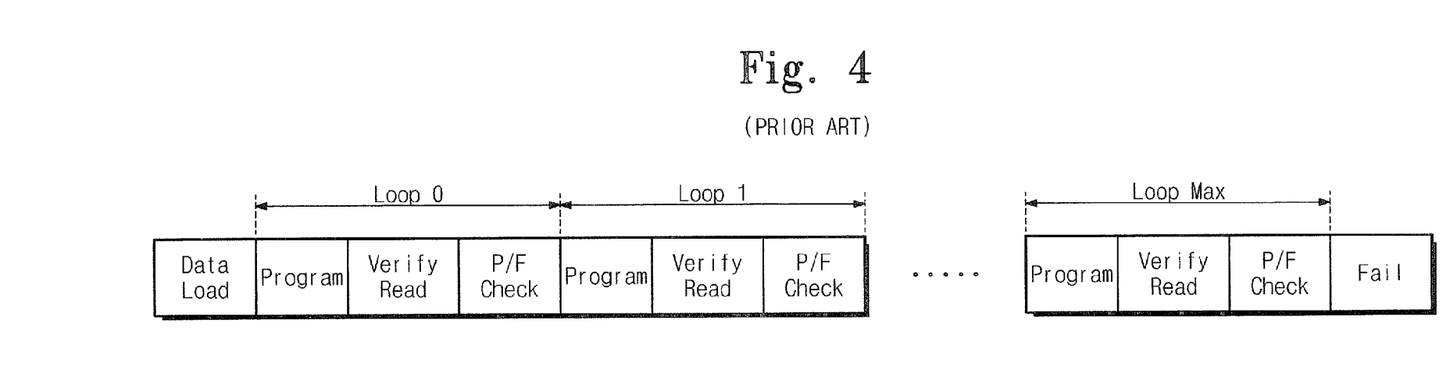
FIG. 4 is a diagram showing a case where a program operation results in a program fail.

FIG. 4 is a diagram showing a case where a program operation results in a program failed. As illustrated in FIG. 4, data is loaded onto a page buffer circuit. Next, a first loop is carried out. Each loop consists of a program operation, a verify read operation, and a pass/fail check operation. A program operation is repeated until it is judged to result in a program fail, with a loop number being increased for each repetition. In the case that a program operation is judged to be failed at a pass/fail check operation of a maximum loop (i.e., Loop Max of FIG. 4), the program mode of operation is ended as a program fail.

A certain amount of time is taken for a pass/fail check operation of a conventional non-volatile memory device. For example, about several microseconds are taken to perform a pass/fail check operation once. As a result, the pass/fail check operation causes performance limitations such that it impedes improvement to a program speed.

SUMMARY OF THE INVENTION

The present invention is directed to provide a non-volatile semiconductor memory device and program method capable of improving a program speed.

The present invention is further directed to provide a non-volatile semiconductor memory device and program method capable of performing a pass/fail check operation selectively based upon a program loop number.

One aspect of the present invention is to provide a program method of a flash memory device which may comprise: programming memory cells via repetition of program loops, a first of the program loops including a program execution interval and a verify read interval, a second of the program loops including the program execution interval, the verify read interval, and a judging interval.

Another aspect of the present invention is to provide a flash memory device which comprises a memory cell array having memory cells arranged in rows and columns; a read/program circuit configured to perform program and read operations to the memory cell array; and a control logic circuit configured to control the read/program circuit so as to perform a judging operation according to a program loop number.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Preferred embodiments of the present invention will be described below in more detail with reference to the accompanying drawings, showing a flash memory device as an example for illustrating structural and operational features by the invention. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 5:
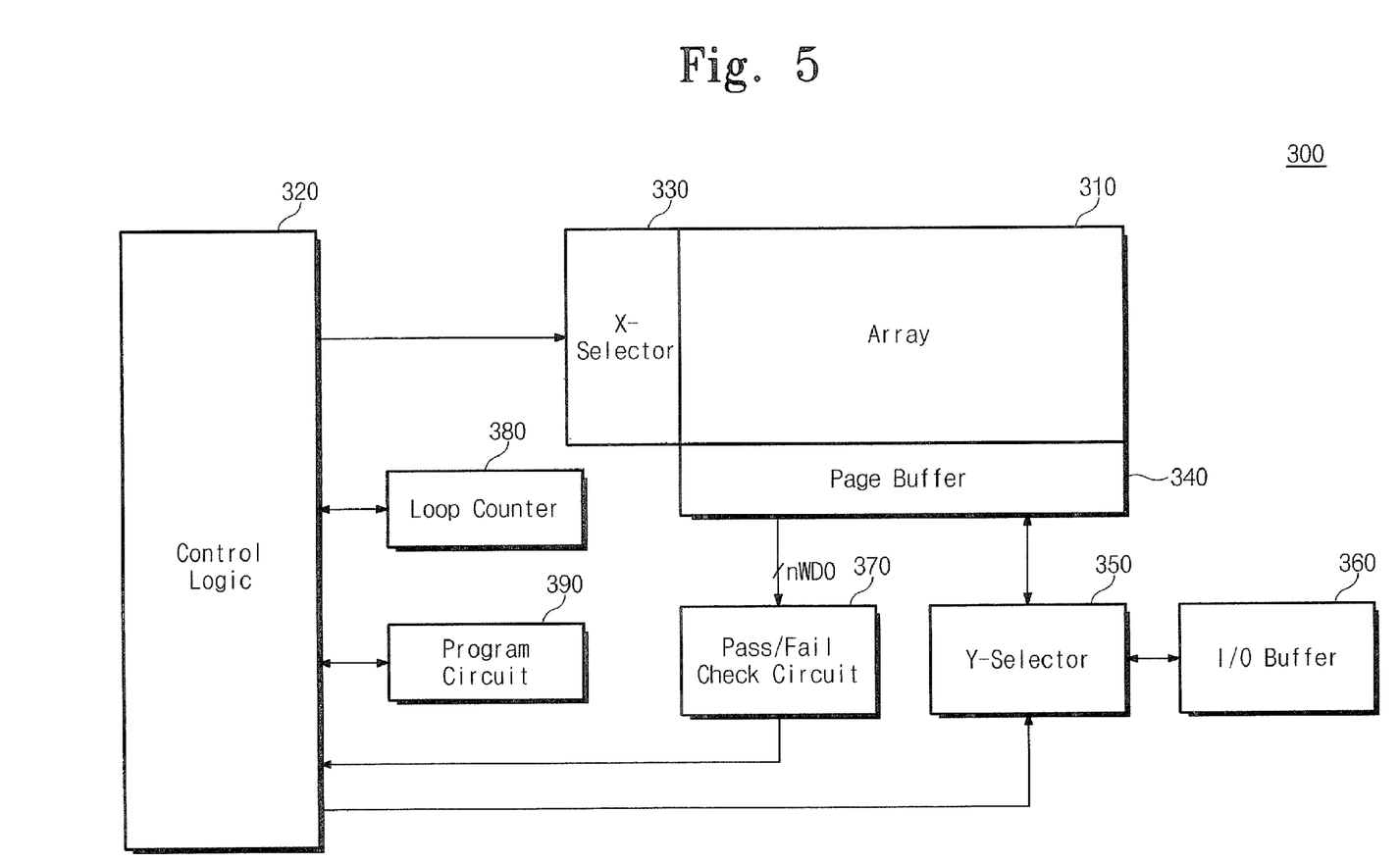
FIG. 5 is a block diagram showing a non-volatile memory device according to an example embodiment of the present invention.

FIG. 5 is a block diagram showing a non-volatile memory device according to an example embodiment of the present invention. Referring to FIG. 5, a non-volatile memory device 300 (e.g., a flash memory device) according to an example embodiment of the present invention may include a memory cell array 310. Although not shown in FIG. 5, the memory cell array 310 may consist of memory cells arranged in a matrix shape of rows (or, word lines) and columns (or, bit lines). Memory cells may be arranged to have a NAND structure or a NOR structure. In exemplary embodiments, memory cells may be arranged to have the NAND structure.

A control logic circuit 320 may be configured to control an overall operation of the non-volatile memory device 300. In exemplary embodiments of the present invention, the control logic circuit 320 may control a set of operations related to a program operation. But, a person skilled in the art will recognize that the control logic circuit 320 is not limited to this disclosure. For example, the control logic circuit 320 may control read, erase, and test operations of the non-volatile memory device 300.

Continuing to refer to FIG. 5, a row selector circuit 330 may be controlled by the control logic circuit 320 and drive selected and unselected rows with corresponding word line voltages in response to a row address. For example, at a program operation, the row selector circuit 330 may drive a selected row with a program voltage and unselected rows with a pass voltage. During a read operation, the row selector circuit 330 may drive a selected row with a read voltage and unselected rows with a pass voltage.

A page buffer circuit 340 may operate as a sense amplifier circuit or a write driver circuit according to a mode of operation. For a read operation, the page buffer circuit 340 may read out data from the memory cell array 310. At a program operation, the page buffer circuit 340 may drive bit lines with a power supply voltage or a ground voltage according to data input via a column selector circuit 350.

The column selector circuit 350 may select data stored in the page buffer circuit 340 or transfer data to the page buffer circuit 340 in response to a column address. An input/output buffer circuit 360 may transfer data from the external to the column selector circuit 350 or receive data from the column selector circuit 350.

A pass/fail check circuit 370 may check whether control signals nWDO from the page buffer circuit 340 have a pass value or a fail value. The checked result may be transferred to the control logic circuit 320. A loop counter circuit 380 may be electrically coupled to the control logic circuit 320 and controlled by the control logic circuit 320 so as to count a program loop number. In other words, the loop counter circuit 380 may keep track of a current program loop number.

A program circuit 390 may be electrically coupled to the control logic circuit 320 and configured to store a maximum program loop number Max Loop and an assigned program loop number N. Further, the program circuit 390 may be configured to make it possible to change the maximum program loop number Max Loop and/or the assigned program loop number N. In exemplary embodiments, the term 'assigned program loop number' may be used interchangeably with a 'reference program loop number.' At a program mode of operation, the control logic circuit 320 may refer to the maximum and assigned program loop numbers that are stored in the program circuit 390. In this embodiment, the row selector circuit, the page buffer circuit, and the pass/fail check circuit may constitute a read/program circuit.

Figure 6:
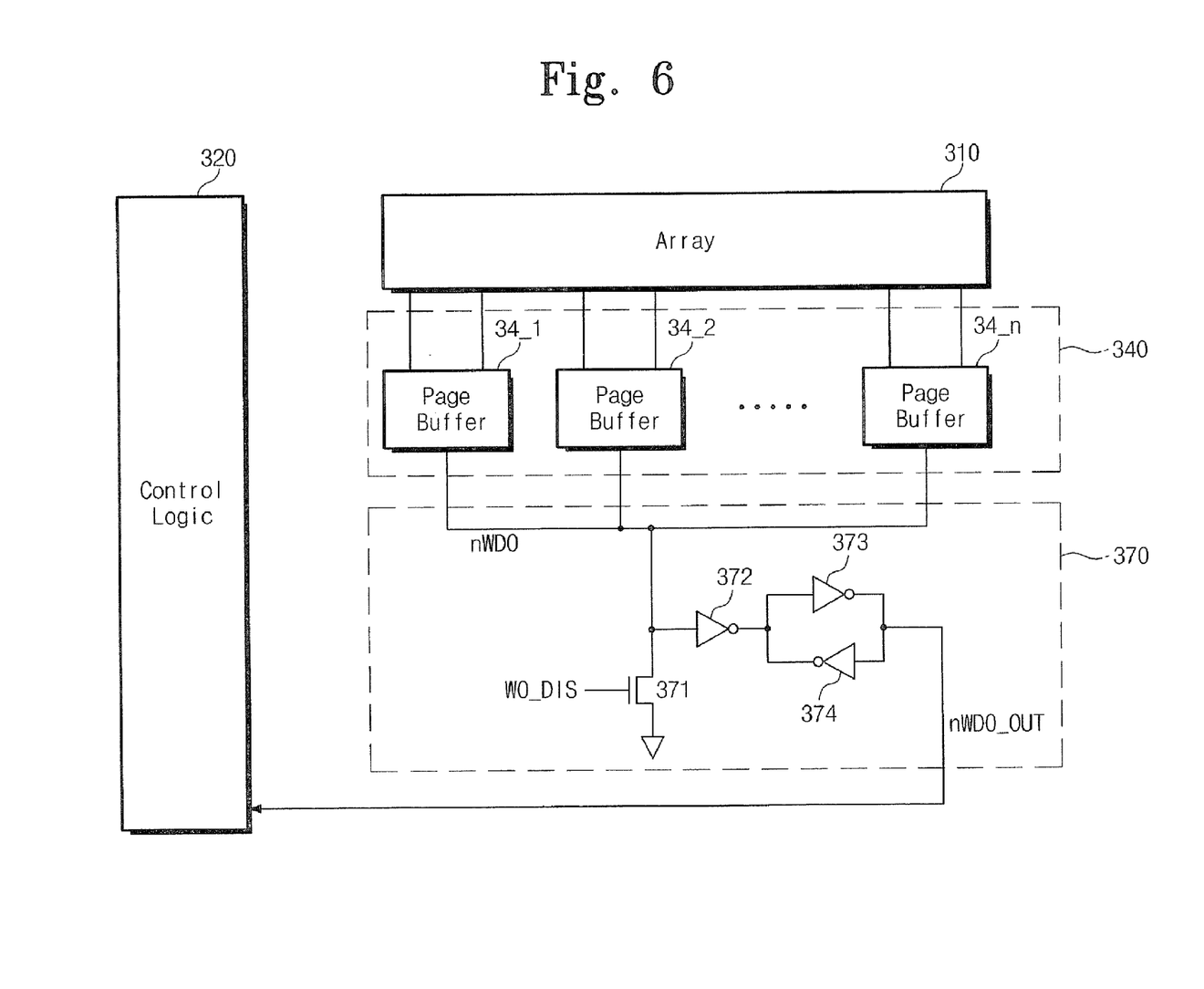
FIG. 6 is a circuit diagram showing the pass/fail check circuit illustrated in FIG. 5.

FIG. 6 is a circuit diagram showing the pass/fail check circuit illustrated in FIG. 5. Referring to FIG. 6, a page buffer circuit 340 may be formed of a plurality of page buffers 34_1~34_n, each of which is configured to output a control signal nWDO. Each of the control signals nWDO indicates whether a memory cell connected to a corresponding page buffer is programmed normally (or, program passed). Each of the control signals nWDO has a logic high or low value based upon whether a memory cell connected to a corresponding page buffer is programmed normally (or, program passed).

A pass/fail check circuit 370 may be a wired-OR circuit that is configured to output a check signal nWDO_OUT in response to the control signals nWDO from the page buffer circuit 340. The pass/fail check circuit 370 may be formed of an NMOS transistor 371 and inverters 372, 373 and 374 which are connected as illustrated in FIG. 6. The inverters 373 and 374 may be configured to form a latch. The inverter 372 may be disposed between the latch and a drain terminal of the NMOS transistor. The check signal nWDO_OUT may be applied to a control logic circuit 320, which may use the check signal to control program loop operations of the memory cell array. The NMOS transistor 371 may be controlled by the WO_DIS control signal. A drain terminal of the NMOS transistor may be directly coupled to each of the page buffer circuits 340. A source of the NMOS transistor may be directly coupled to ground.

Figure 7:
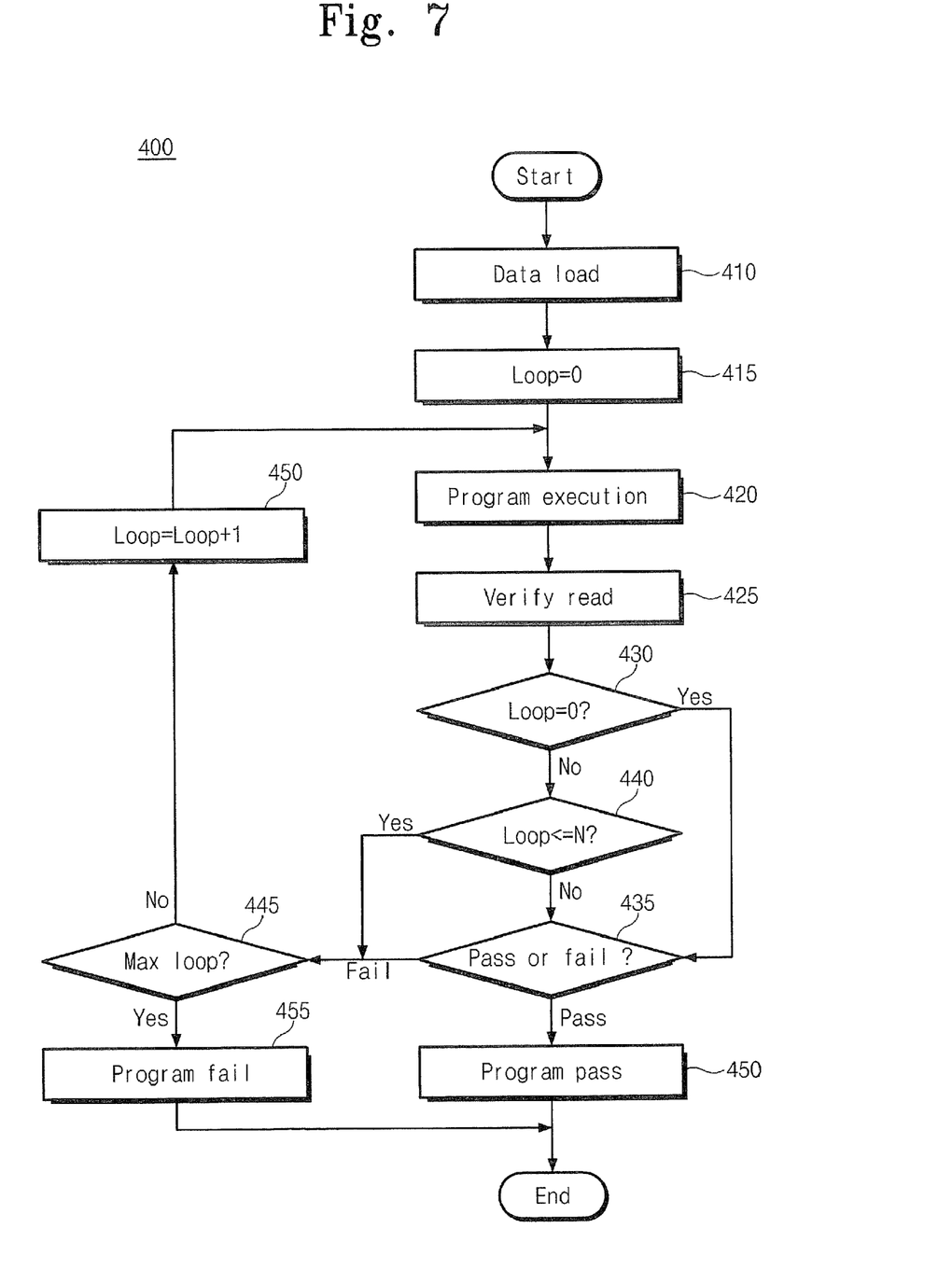
FIG. 7 is a flow diagram for describing a program operation of a non-volatile memory device according to one embodiment of the present invention.

FIG. 7 is a flow diagram for describing a program operation of a non-volatile memory device according to one embodiment of the present invention. The program operation is described with reference to the accompanying drawings.

Once a program mode of operation commences, at block 410, data to be programmed may be loaded onto a page buffer circuit 340 of the non-volatile memory device 300. At block 415, a program loop number is reset to '0.' At block 420, a program execution interval is indicated, such that the loaded data in the page buffer circuit 340 may be programmed in selected memory cells.

After programming the selected memory cells, at block 425, a verify read operation may be made to judge whether each of the programmed memory cells has a desired threshold voltage. The read data may be stored in the page buffer circuit 340. The term 'verify read operation' may be used interchangeably with the term 'verify read interval.'

After the verify read operation/interval, at block 430, a control logic circuit 320 checks whether a current program loop is a first program loop. If a current program loop is judged to be the first (i.e., an initial) program loop, i.e., when Loop=0, the procedure goes to block 435, in which a pass/fail check operation is made. As a pass/fail check result, if control signals nWDO from the page buffer circuit 340 all have a program pass value (e.g., '0'), at block 450, the program operation is judged as a program pass. Afterwards, the program operation is ended. If at least one of the control signals nWDO from the page buffer circuit 340 has a program fail value (e.g., '1'), the procedure goes to block 445. In exemplary embodiments, the term 'pass/fail check operation' may be used interchangeably with the term 'judging period.' The pass/fail check operation in the initial program loop may be programmed to skip a separate program operation when the loaded data is program-inhibited data, that is, data that does not necessitate a program operation.

If a current program loop is not the initial program loop, the procedure goes to block 440, in which the control logic circuit 320 may judge whether a current program loop number is less than or the same as an assigned program loop number in a program circuit 390.

If a current program loop number is judged to exceed the assigned program loop number, the procedure goes to the block 435, in which a pass/fail check operation is made. On the other hand, if a current program loop number is judged to be less than the assigned program loop number, the procedure goes to block 445, in which the control logic circuit 320 may judge whether a current program loop number has reached a maximum program loop number. If the current program loop number is judged to be less than the maximum program loop number, then at block 450, the current program loop number is increased by 1, and the procedure returns to the block 420. Conversely, if the current program loop number is judged to have reached the maximum program loop number at block 445, then the procedure proceeds to block 455, where the program operation is judged as a program fail.

As understood from the above description, it is possible to perform a program operation in a higher speed by skipping a pass/fail check operation until a current program loop number reaches an assigned program loop number being less than the maximum program loop number.

Figure 8:
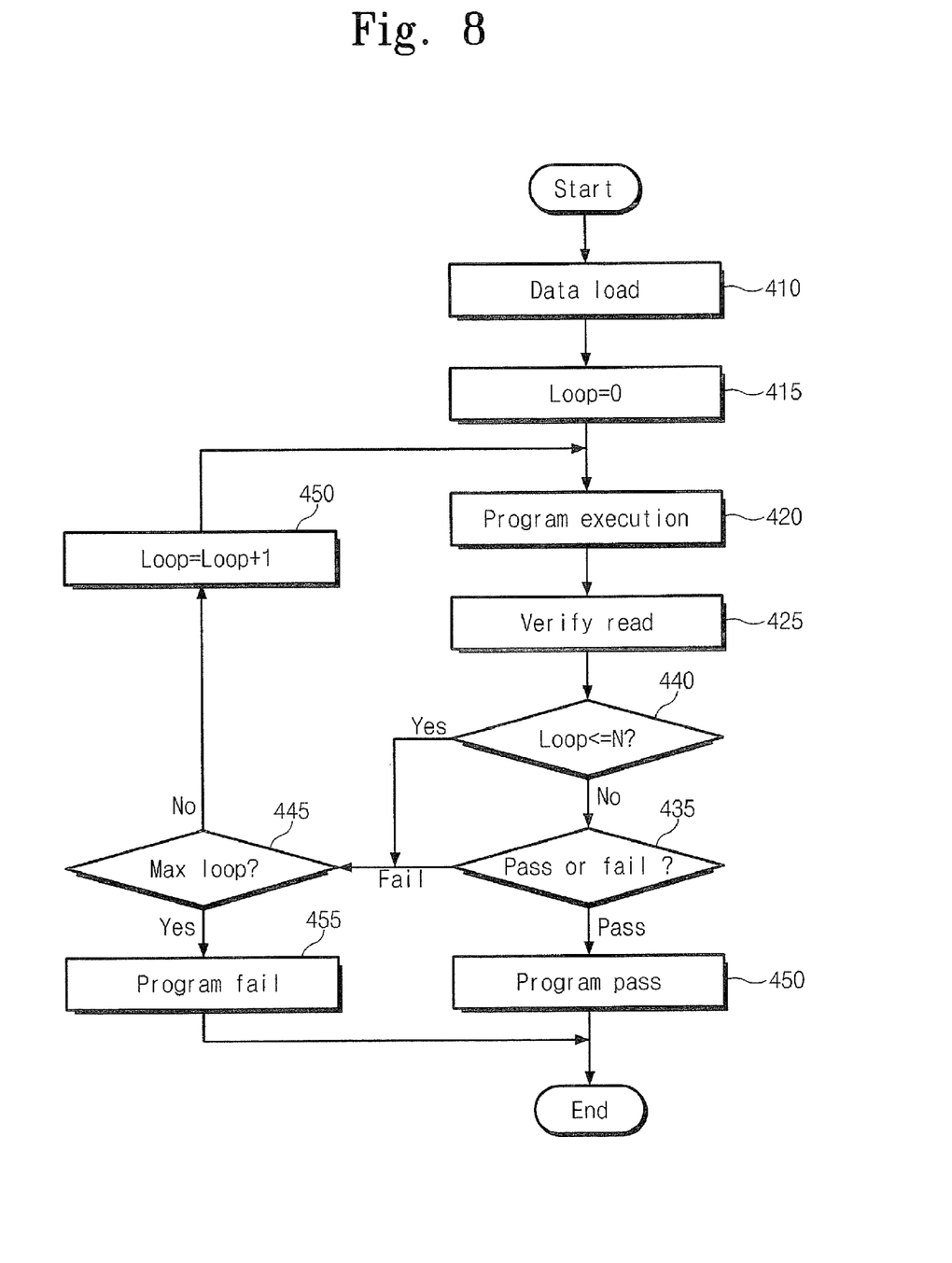
FIG. 8 is a flow diagram for describing a program operation of a non-volatile memory device according to another embodiment of the present invention.

FIG. 8 is a flow diagram for describing a program operation of a non-volatile memory device according to another embodiment of the present invention. The program operation illustrated in FIG. 8 is substantially identical to that illustrated in FIG. 7 except that block 430 for judging whether a current program loop is an initial program loop is not included (i.e., operation 430 is skipped). Thus, a detailed description for the program operation illustrated in FIG. 8 will be omitted for brevity.

Figure 9:
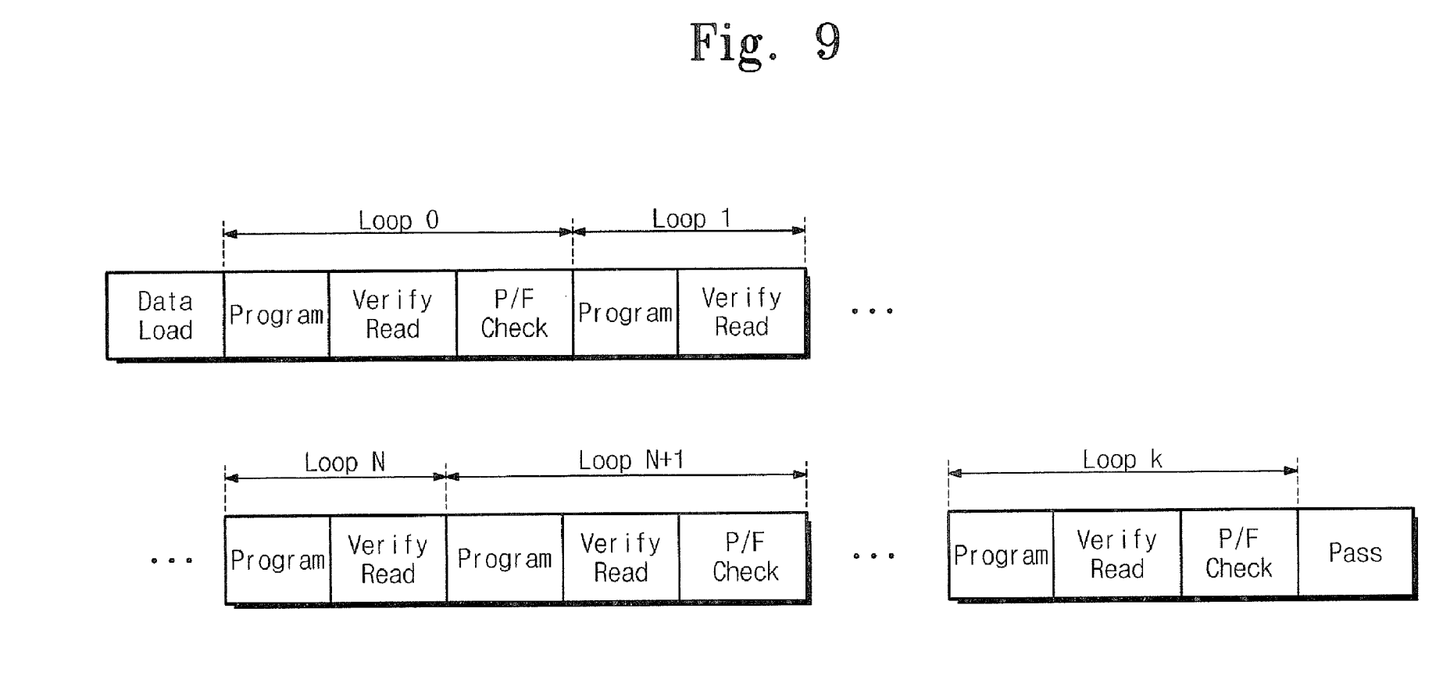
FIG. 9 is a flow diagram showing a case where a program operation results in a program pass, according to some embodiments of the present invention.

FIG. 9 is a flow diagram showing a case where a program operation results in a program pass, according to some embodiments of the present invention.

First, data to be programmed is loaded onto a page buffer circuit 340. An initial program loop is executed, which consists of a program interval, a verify read interval, and a pass/fail check interval. A second program loop may be executed when a pass/fail check result of the initial program loop indicates a program fail. A pass/fail check operation is not carried out until a program loop reaches an Nth program loop. In other words, only program and verify read operations are performed at each of second to nth program loops.

After the Nth program loop, a pass/fail check operation may be carried out every program loop until a pass/fail check result indicates a program pass. As illustrated in FIG. 9, in the case that a pass/fail check result of a kth program loop is judged to be a program pass, the program operation is ended as a program pass.

Figure 10:
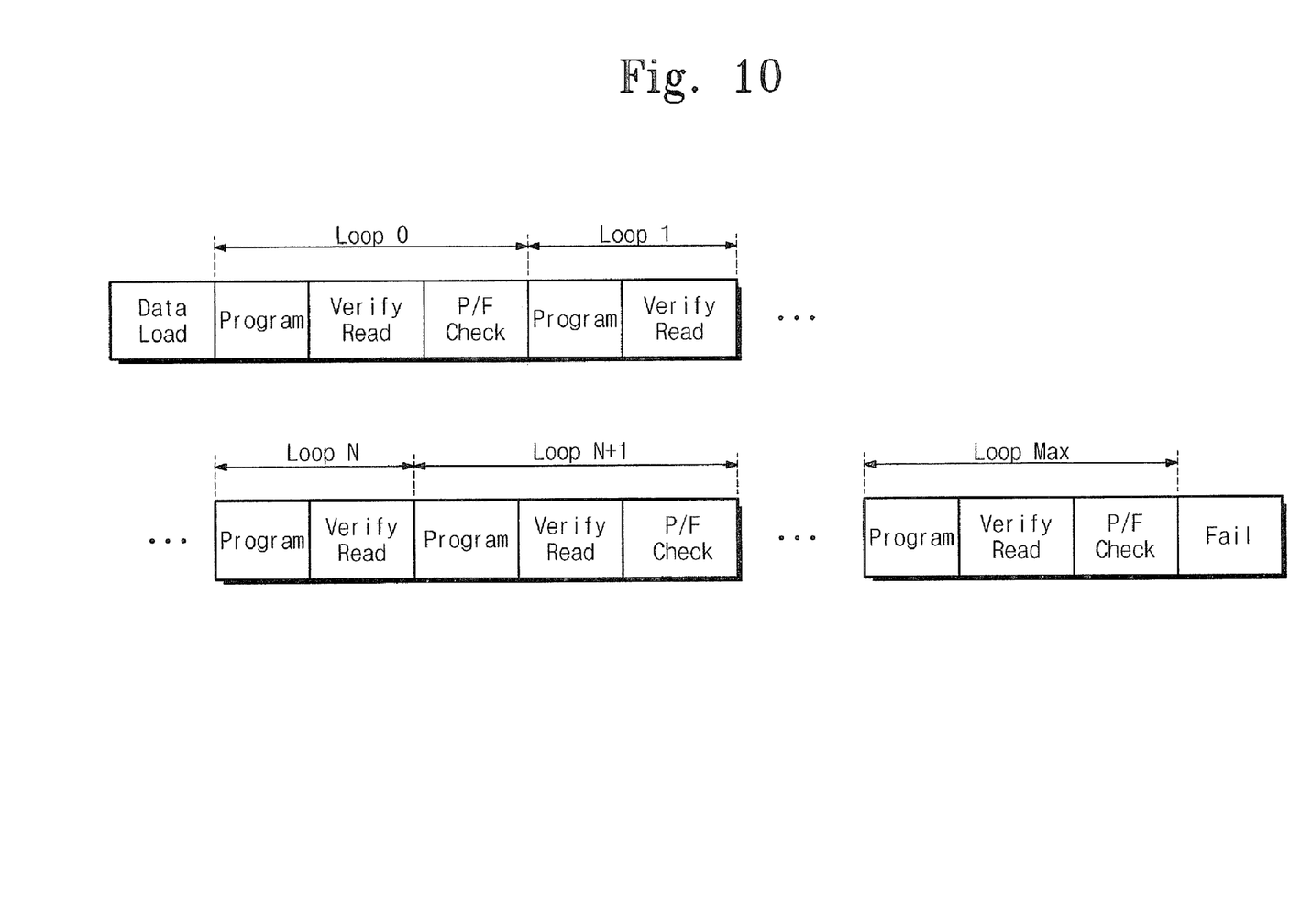
FIG. 10 is a diagram showing a case where a program operation results in a program fail, according to some embodiments of the present invention.

FIG. 10 is a diagram showing a case where a program operation results in a program fail, according to some embodiments of the present invention. First, data to be programmed is loaded onto a page buffer circuit 340. An initial program loop is executed, which consists of a program interval, a verify read interval, and a pass/fail check interval. A second program loop may be executed when a pass/fail check result of the initial program loop indicates a program fail. A pass/fail check operation is not carried out until a program loop reaches an Nth program loop. In other words, only program and verify read operations are performed at each of second to nth program loops.

After the Nth program loop, a pass/fail check operation may be carried out every program loop until a pass/fail check result indicates a program pass. As illustrated in FIG. 10, in the case that a pass/fail check result of a maximum program loop is judged to be a program fail, the program operation is ended as a program fail.

As described in FIGS. 9 and 10, it is possible to reduce a time needed for a program operation by skipping a pass/fail check operation within predetermined program loops.

Figure 11:
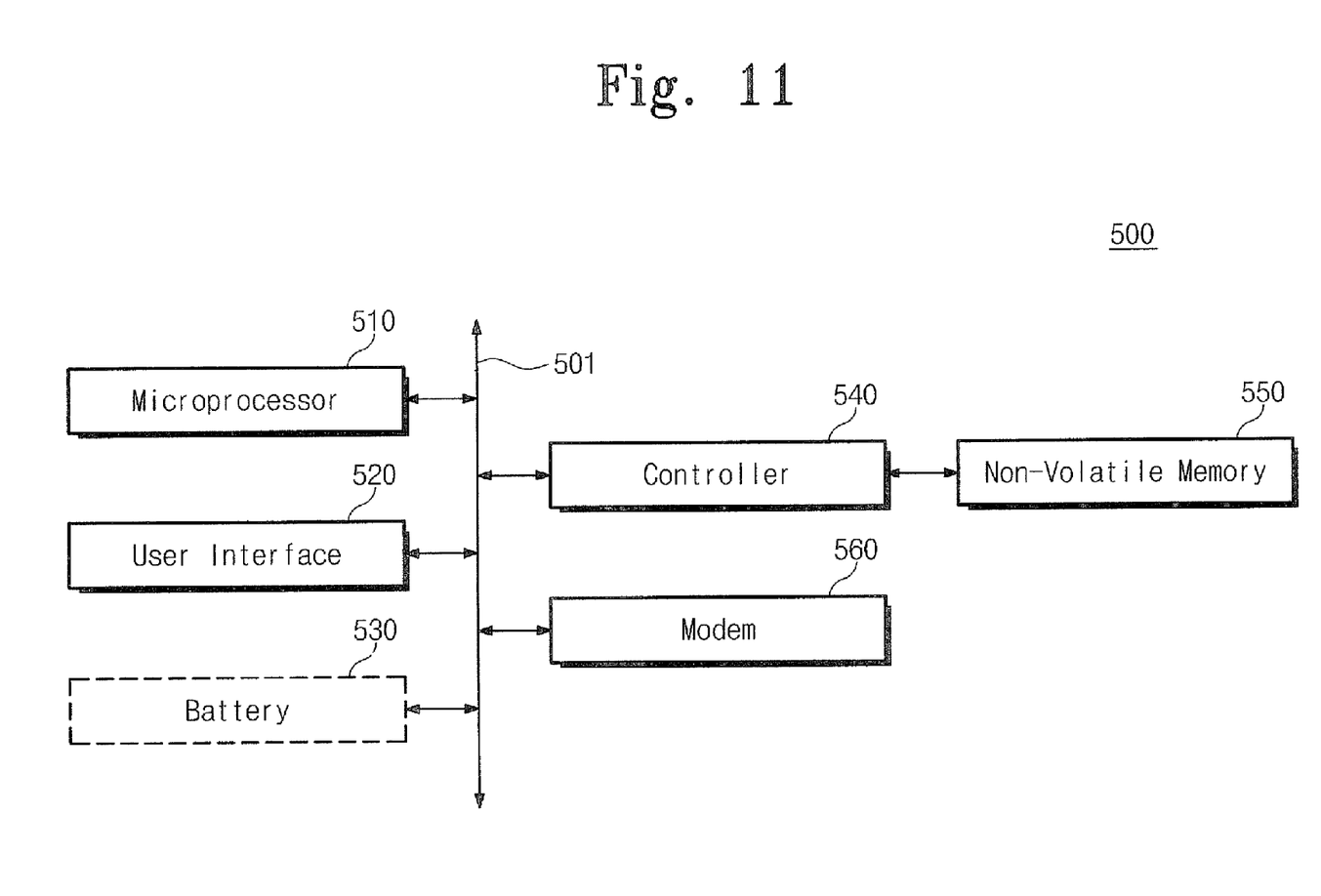
FIG. 11 is a block diagram showing a computing system including a non-volatile memory device according to some embodiments of the present invention.

FIG. 11 is a block diagram showing a computing system including a non-volatile memory device according to some embodiments of the present invention.

A computing system 500 according to some embodiments of the present invention may include a microprocessor 510, a user interface 520, a modem 530 such as a baseband chipset, a memory controller 540, and a non-volatile memory device 550, which are connected to a bus 501. Persons with skill in the art will recognize that the memory controller 540 and the non-volatile memory device 550 constitute a memory card. The non-volatile memory device 550 may be substantially identical to that illustrated in FIG. 5.

N-bit data to be processed by the microprocessor 510 may be stored in the non-volatile memory device 550 via the memory controller 540. N may be an integer greater than or equal to 1.

In the case that the present computing system is a mobile apparatus, it may further comprise a battery 530 for supplying an operating voltage to the computing system. Although not illustrated in FIG. 11, the computing system according to the present invention may further comprise application chipsets, a camera image processor (CIS), mobile DRAM, and the like.

According to some embodiments, a program method of a flash memory device may comprise: programming memory cells via repetition of program loops, a first of the program loops including a program execution interval and a verify read interval, a second of the program loops including the program execution interval, the verify read interval, and a judging interval.

According to some embodiments, the program loops may selectively include the judging interval.

According to some embodiments, the memory cells may constitute a page.

According to some embodiments, a program method of a flash memory device may comprise: performing a program operation via program loops, each program loop including a program execution interval and a verify read interval, wherein each program loop includes a judging interval based on whether a program loop number exceeds a reference program loop number.

According to some embodiments, when the program loop number is less than the reference program loop number, the judging interval may be included in the program loops.

According to some embodiments, when the program loop indicates an initial program loop, the judging interval may be included in the program loops.

According to some embodiments, when the program loop number is identical to or less than the reference program loop number, each program loop includes the program execution interval and the verify read interval.

According to some embodiments, when the program loop number exceeds the reference program loop number, each program loop includes the program execution interval, the verify read interval, and the judging interval.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
    a memory cell array having memory cells arranged in rows and columns;
    a read/program circuit configured to perform program and read operations to the memory cell array; and
    a control logic circuit configured to control the read/program circuit to perform a judging operation according to a program loop number,
    wherein when the program loop number indicates an initial program loop, the control logic circuit controls the read/program circuit to perform the judging operation, and
    wherein when the program loop number is greater than a reference program loop number, the control logic circuit controls the read/program circuit to perform the judging operation.

2. The flash memory device of claim 1, wherein (a) when the program loop number is less than or equal to the reference program loop number and (b) when the program loop number does not indicate the initial program loop, then the control logic circuit controls the read/program circuit so as not to perform the judging operation.

3. The flash memory device of claim 1, wherein the read/program circuit comprises:
    a row selector circuit configured to select rows of the memory cell array;
    a page buffer circuit coupled to the memory cell array via the columns; and
    a pass/fail check circuit configured to generate at least one of a program pass and program fail result responsive to the program loop number.

4. A flash memory device comprising:
    a memory cell array having memory cells arranged in rows and columns;
    a control logic circuit configured to control the read/program circuit to perform a judging operation according to a program loop, the control logic circuit including:
        a loop counter circuit electrically coupled to the control logic circuit and configured to count the program loop to maintain a current program loop number;
        a program circuit electrically coupled to the control logic circuit and configured to store a maximum loop number and a reference loop number; and
    a pass/fail check circuit electrically coupled to the control logic circuit,
    wherein the control logic circuit is configured to determine (a) that the current program loop number is less than or equal to the reference loop number and (b) that the current program loop number is not an initial program loop number, and wherein the pass/fail check circuit is configured so as not to perform a pass/fail check operation responsive to (a) and (b).

5. The flash memory device of claim 4, wherein the control logic circuit is configured to determine whether the current program loop number is the initial program loop number and to indicate to the pass/fail check circuit whether to perform a pass/fail check operation responsive to the determination.

6. The flash memory device of claim 4, wherein the control logic circuit is configured to determine that the current program loop number is greater than the reference loop number, and wherein the pass/fail check circuit is configured to perform a pass/fail check operation and to generate at least one of a program pass and a program fail result responsive to the determination.

7. The flash memory device of claim 4, wherein a program fail is generated responsive to the current program loop number being greater than the maximum loop number.

8. The flash memory device of claim 4, further comprising a plurality of page buffer circuits electrically coupled to the memory cell array, each page buffer circuit configured to store (a) data and (b) a control signal indicating at least one of a program pass value and a program fail value.

9. The flash memory device of claim 8, wherein the pass/fail check circuit comprises an NMOS transistor, a drain terminal of the NMOS transistor being directly coupled to each of the page buffer circuits and configured to receive the control signal indicating at least one of the program pass value and the program fail value.

10. The flash memory device of claim 9, wherein a source of the NMOS transistor is directly coupled to ground.

11. The flash memory device of claim 10, wherein the pass/fail check circuit further comprises first and second inverters configured to form a latch circuit, and a third inverter disposed between the latch circuit and the drain terminal of the NMOS transistor.

12. The flash memory device of claim 11, wherein a line electrically couples an output of the latch circuit to the control logic circuit and is configured to transmit a check signal from the pass/fail check circuit to the control logic circuit responsive to at least one of the program pass value and the program fail value, wherein the control logic circuit uses the check signal to control program loop operations of the memory cell array.

13. A memory card comprising:
a flash memory device; and
a memory controller configured to control the flash memory device,
wherein the flash memory device comprises:
a control logic circuit configured to program memory cells of the flash memory device via repetition of program loops, each of the program loops including a program execution interval and a verify read interval, the control logic circuit further configured to include a judging interval in each of the program loops responsive to a program loop number indicating an initial program loop or responsive to whether the program loop number exceeds a reference program loop number.

14. The memory card of claim 13, wherein the memory card is adapted to be connected to a system, the system comprising:
a bus; and
a microprocessor capable of being coupled to the bus, the microprocessor being configured to process N-bit data and to store the N-bit data in the flash memory device via the memory controller, wherein N is an integer greater than or equal to 1.

15. The memory card of claim 14, wherein the system further comprises a user interface.

16. The memory card of claim 14, wherein the system further comprises a battery to supply an operating voltage to the system.

17. The memory card of claim 14, wherein the system further comprises a modem.

18. The memory card of claim 17, wherein the modem includes a baseband chipset.

* * * * *